(12) United States Patent
Winstead et al.

(10) Patent No.: US 7,418,468 B2
(45) Date of Patent: Aug. 26, 2008

(54) LOW-VOLTAGE CMOS CIRCUITS FOR ANALOG DECODERS

(75) Inventors: Chris J. Winstead, Logan, UT (US);
Christian Schlegel, Edmonton (CA)

(73) Assignee: University of Alberta, Edmonton, Alberta (CA)

( * ) Notice: Subject to any disclaimer, the term of this patent is extended or adjusted under 35 U.S.C. 154(b) by 678 days.

(21) Appl. No.: 11/056,063

(22) Filed: Feb. 10, 2005

(65) Prior Publication Data

US 2006/0004901 A1  Jan. 5, 2006
US 2007/0276895 A9  Nov. 29, 2007

Related U.S. Application Data (60) Provisional application No. 60/544,191, filed on Feb. 13, 2004.

(51) Int. Cl.
*G06F 7/52* (2006.01)
*G06G 7/16* (2006.01)
*H03M 13/00* (2006.01)

(52) U.S. Cl. .................. 708/620; 708/835; 714/755
(58) Field of Classification Search .............. 708/603, 708/720, 835; 714/755
See application file for complete search history.

(56) References Cited

U.S. PATENT DOCUMENTS 5,115,409 A * 5/1992 Stepp ................ 708/835
5,712,810 A * 1/1998 Kimura .............. 708/835
6,584,486 B1 * 6/2003 Helfenstein et al. ...... 708/835
7,024,448 B2 * 4/2006 Matsugaki et al. ....... 708/835

* cited by examiner

*Primary Examiner*—Chuong D Ngo (57) ABSTRACT

Low-voltage CMOS (Complementary Metal Oxide Semiconductor) circuits, suitable for analog decoders, for example, are provided. The circuits include multiplier modules that receive first input signals and respective ones of a plurality of second input signals. Each multiplier module generates as output signals products of the first input signals and its respective second input signals. Dummy multiplier modules that respectively correspond to the multiplier modules receive the second input signals, and each dummy multiplier module forms products of the second input signal of its corresponding multiplier module and the other second input signals. The dummy multiplier modules reduce the overall voltage requirements of the circuit, thereby providing for low-voltage operation. In some embodiments, a connectivity module receives output signals from the multiplier modules and generates as output signals sums of predetermined ones of the output signals, and a renormalization module receives and normalizes the output signals from the connectivity module to generate output signals that sum to a predetermined unit value.

21 Claims, 11 Drawing Sheets

LOW-VOLTAGE CMOS CIRCUITS FOR ANALOG DECODERS

CROSS REFERENCE TO RELATED APPLICATION

This application claims the benefit of U.S. Provisional Patent Application, Ser. No. 60/544,191 which was filed on Feb. 13, 2004.

FIELD OF THE INVENTION

The present invention relates to signal decoding, and in particular to analog decoders.

BACKGROUND OF THE INVENTION

In the mid-1990's, a new class of error correcting codes called "Turbo codes" was introduced [3]. Turbo codes achieve performance, typically measured in BER (bit error rate), very close to a long sought-after limit known as the Shannon bound. The decoding algorithms used in Turbo codes have since been generalized into a class of decoding algorithms based on factor graphs [17, 6]. These algorithms are commonly referred to as message-passing algorithms. Turbo-like codes which employ message-passing algorithms are generally referred to as iterative decoders.

An important general form of message passing algorithms is the sum-and-product algorithm [9], which implements probability propagation on a graph. The sum-and-product algorithm is a very general algorithm which describes decoders for many codes, including trellis codes, LDPC (low-density parity check) codes, block product codes, BCJR (Bahl, Cocke, Jelinek, Raviv) codes [2], and Turbo codes. The sum-and-product algorithm also describes algorithms used in artificial intelligence.

There has been great interest in implementing iterative decoders, but conventional digital implementations are often complex and demand expensive resources. Analog circuits for iterative decoding have been proposed and demonstrated by various researchers in recent years [10, 7, 12, 13, 14, 8, 15, 18]. CMOS (Complementary Metal Oxide Semiconductor) circuits are of particular interest for some applications because they can be implemented in ordinary so-called "plain vanilla" CMOS processes, which are low-cost compared to high-end alternatives such as BiCMOS and SiGe. CMOS analog decoders can also be more easily integrated with other CMOS components for single-chip receiver solutions.

In many cases, analog decoders offer significant advantages over digital designs. For example, the operations required for implementing the sum-and-product or BCJR algorithms can be implemented in analog decoders with fewer transistors. Analog circuits also require significantly fewer wire connections between components. Such efficient use of space allows parallel circuit implementations to enable decoding operations to occur completely in parallel, which thereby provides for high data throughput.

Analog decoders are also intrinsically low-power, and eliminate the need for high speed analog-to-digital (A/D) conversion in a receiver front-end. A typical A/D converter by itself consumes a significant amount of power and silicon real-estate. An analog decoder may thus be thought of as an information A/D converter, specially designed to convert coded analog channel information into decoded bits.

SUMMARY OF THE INVENTION

In one aspect, the invention provides an electronic circuit comprising a plurality of multiplier modules for receiving a plurality of first input signals and respective ones of a plurality of second input signals, each multiplier module configured to generate as output signals products of the plurality of first input signals and its respective one of the plurality of second input signals, and a plurality of dummy multiplier modules for receiving the plurality of second input signals, each dummy multiplier module corresponding to a respective one of the plurality of multiplier modules and configured to form products of the respective one of the plurality of second input signals of its corresponding multiplier module and the second input signals other than the respective one of the plurality of second input signals.

Each of the multiplier modules preferably comprises a plurality of transistors for receiving respective ones of the plurality of first input signals and the respective one of the plurality of second input signals. Each of the plurality of transistors preferably comprises a control terminal for receiving the respective one of the plurality of first input signals, a first switched terminal for receiving the respective one of the plurality of second input signals, and a second switched terminal on which the output signals are generated.

The dummy multiplier modules preferably have a similar structure, comprising a plurality of transistors for receiving the respective one of the plurality of second input signals and respective ones of the other second input signals, with each transistors comprising a first switched terminal for receiving the respective one of the plurality of second input signals, a control terminal for receiving the respective one of the other second input signals, and a second switched terminal on which the products are formed.

In one embodiment, a connectivity module receives the output signals from the plurality of multiplier modules and generates as output signals sums of predetermined ones of the output signals from the multiplier modules. The connectivity module preferably comprises inputs for receiving the output signals from the plurality of multiplier modules and outputs for outputting the output signals of the connectivity module. Connections between the inputs and the outputs determine the predetermined ones of the output signals from the multiplier modules.

A renormalization module is also provided in some embodiments for receiving the output signals from the connectivity module and normalizing the output signals from the connectivity module to thereby generate output signals that sum to a predetermined unit value.

The invention also provides, in another aspect, a sum-product circuit comprising a plurality of first inputs for receiving respective first input signals, a plurality of second inputs for receiving second input signals, a plurality of multiplier modules connected to the first inputs and a respective one of the second inputs, each multiplier module configured to generate as intermediate output signals products of the first input signals and the second input signal on its respective one of the second inputs; a plurality of dummy multiplier modules connected to the second inputs, each dummy multiplier module corresponding to a respective one of the plurality of multiplier modules and configured to form products of the second input signal of its corresponding multiplier module and the second input signals other than the second input signal of its corresponding multiplier module; a connectivity module for receiving the intermediate output signals and configured to generate as output signals sums of predetermined ones of the intermediate output signals; and a plurality of output terminals for outputting the output signals.

The sum-product circuit may also include a plurality of reset switches connected across the first inputs, the second inputs, and the outputs and configured to short the first inputs, to short the second inputs, and to short the outputs in response to a reset signal.

Other aspects and features of the present invention will become apparent, to those ordinarily skilled in the art, upon review of the following description of the specific embodiments of the invention.

BRIEF DESCRIPTION OF THE DRAWINGS

The invention will now be described in greater detail with reference to the accompanying diagrams, in which.

DETAILED DESCRIPTION OF THE PREFERRED EMBODIMENTS

The sum-product algorithm [9, 17] is a general framework for expressing probability propagation on factor graphs. The purpose of the algorithm is to compute global conditional probabilities using only local constraints. Constraints are often expressed by factor graphs [5, 9, 17]. Special cases of factor graphs include trellis graphs and Tanner graphs, which are also referred to as constraint graphs. According to one embodiment of the invention, the sum-product algorithm is implemented on graphs which express boolean functions on discrete-type variables.

Figure 1:
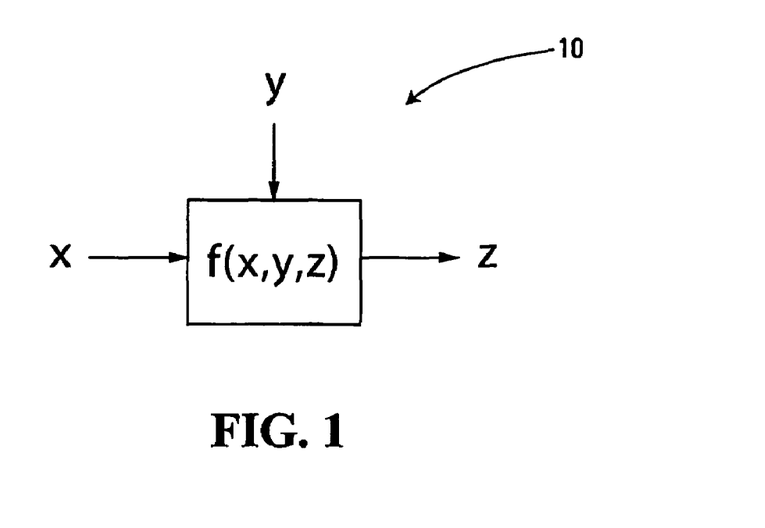
FIG. 1 is a factor graph of a constraint function of three variables.

For example, consider the implementation of graphs which can be simplified to local boolean constraints on three variables. FIG. 1 is a factor graph of such a constraint function of three variables. The function $f$ expresses a relationship between variables x, y, z, which can take values from discrete alphabets $A_x$, $A_y$, $A_z$, respectively. The function $f(x,y,z)$ is a boolean constraint on $(x,y,z)$ if $f(x,y,z) \in \{0,1\}$ for all x, y, and z, and the constraint $f$ is said to be satisfied if and only if $f(x,y,z)=0$.

The constraint $f$ and the variables (x,y,z) have, up to this point, been defined as deterministic. When (x,y,z) are random variables, denoted herein with boldface type, they are characterized by probability, masses instead of exact values. The goal of probability propagation is to determine the probability mass of z, written $\rho_z$, based on known masses $\rho_x$ and $\rho_y$. Normal typeface for these variables indicates particular samples or values of the random variables.

The local operations of the sum-product algorithm are described as follows. The constraint $f$ is mapped to a processing node which receives probability masses for variables x and y. These variables are assumed to be independent of each other. The processing node then computes the probability mass of z based on the constraint $f$ and the masses of x and y. Let $S_f$ be the set of combinations of (x,y,z) for which $f(x,y,z)$ is satisfied. Let $S_f(j)$ be the subset of $S_f$ for which z=j, where $j \in A_z$. We then compute, for each j, the function $$P(z = j) = \eta \cdot \sum_{(k,l) \in S_f(j)} P(x = k) \cdot P(y = l), \quad (1)$$

or equivalently $$\rho_z(j) = \eta \cdot \sum_{(k,l) \in S_f(j)} \rho_x(k) \cdot \rho_y(l),$$

where $k \in A_x$ and $l \in A_y$, $\eta$ is any non-zero constant real number, and x, y, and z are random variables. The constant $\eta$ is typically chosen so that $\Sigma_j P(z=j)=1$. In principle, though, the accuracy of the algorithm is indifferent to $\eta$.

The local computation (1), is the heart of the sum-product algorithm. A complete sum-product decoder consists of many interconnected instances of (1).

Figure 2:
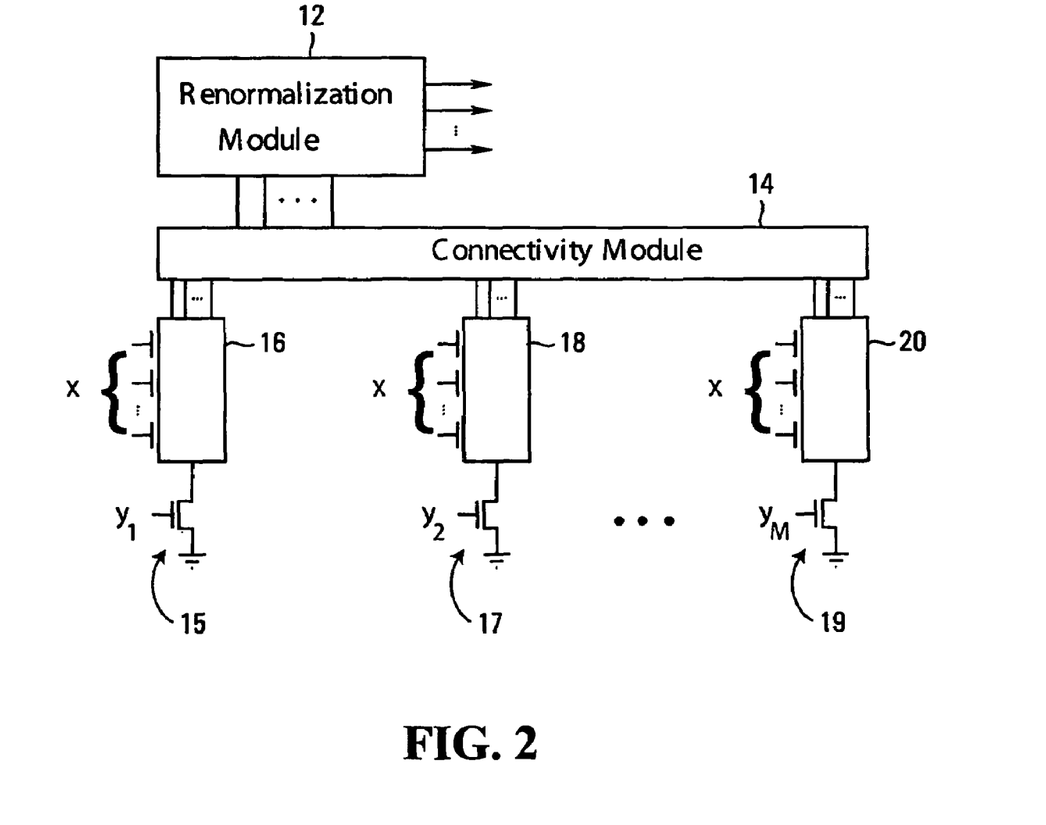
FIG. 2 is a block diagram of a Gilbert-based sum-product circuit.

One approach for CMOS analog decoder designs, elaborated in [10], has emerged as a popular topology for analog decoder designs. This topology is based on a generalized Gilbert multiplier. FIG. 2 is a block diagram of a Gilbert-based sum-product circuit, comprising a renormalization module 12, a connectivity module 14, a plurality of multiplier modules 16, 18, 20, and a plurality of column input transistors, three of which are shown at 15, 17, 19, which behave as analog current sources. Because of its popularity, the architecture of FIG. 2 is referred to herein as the canonical topology.

Figure 3A:
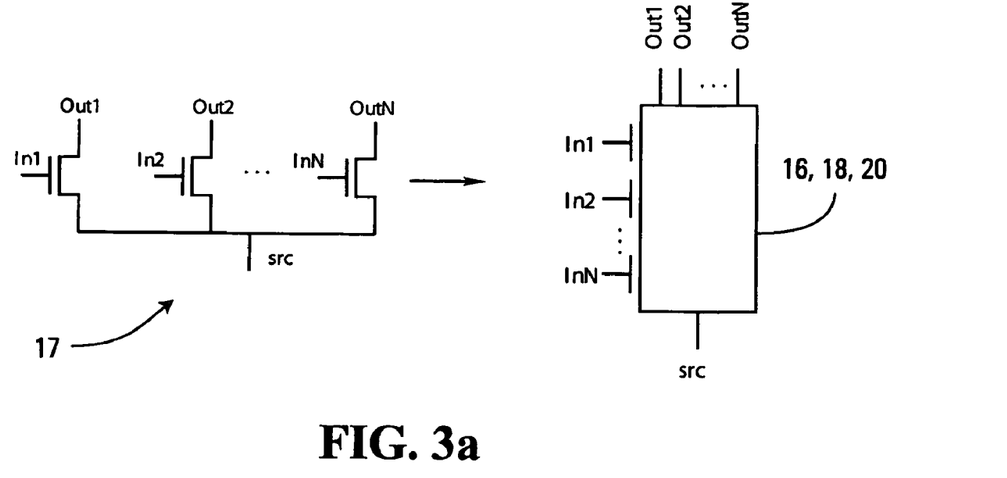
FIG. 3a is a schematic diagram of an array of source-connected transistors as an example implementation of the blocks 16, 18, and 20 of FIG. 2.

In typical implementations of a Gilbert circuit, each multiplier module 16, 18, 20 includes an array of source-connected transistors, such as the array 17 shown in FIG. 3a.

Figure 3B:
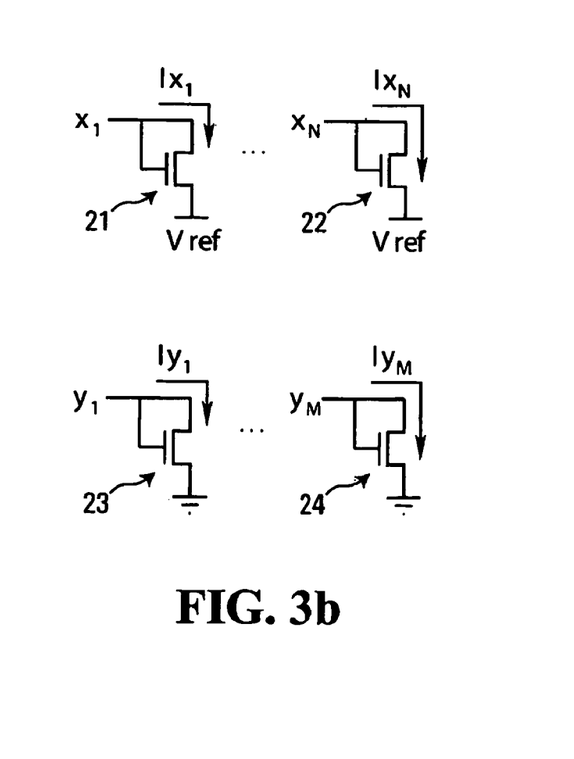
FIG. 3b is a schematic diagram of diode-connected transistors for converting voltages to currents.

In FIG. 2, X denotes an ordered sequence of row inputs (voltages) $X=<x_1, \ldots, x_N>$, and Y denotes an ordered sequence of column inputs (voltages) $Y=<y_1, \ldots, y_M>$. Many circuit implementations convert current inputs $Ix_i$ and $Iy_k$ into voltage inputs $x_i$ and $y_k$ using diode-connected transistors, for example, such as shown in FIG. 3b, corresponding to transistors 21, 22 and 23, 24. All of the transistor devices implementing the canonical topology typically have the same dimensions.

For the purposes of simplifying circuit analysis, assume that $Ix_i \propto \rho_x(i)$ and that $Iy_j \propto \rho_x(j)$, so that the current-mode column and row inputs represent probability masses.

Intermediate outputs emerge from the top of the multiplier modules 16, 18, and 20 in FIG. 2. There are N×M such outputs, which will be referred to as $Iz_{ij}$, corresponding to one row position i and one column position j. These intermediate outputs represent multiplication of row and column inputs, $Iz_{ij} \propto Ix_i \cdot Iy_j$, thus performing the "product" portion of (1). To complete the computation of (1), summation of desired products is accomplished by shorting wires in the connectivity module 14. As those skilled, in the art will appreciate, unused products, namely those for which the constraint $f$ is not satisfied, are shorted to Vdd.

The Gilbert multiplier consists of MOS transistors biased in the sub threshold region, meaning $v_{gs} < V_{Th}$ for each transistor, where $v_{gs}$ refers to the voltage between the gate and source of an MOS device, and $V_{th}$ refers to the threshold voltage. In digital design, sub threshold transistors are usually regarded as "off." A more precise model of their behaviour is given by $$I_D = I_0 \frac{W}{L} \exp\left(\frac{\kappa \cdot v_{gs}}{U_T}\right)\left[1 - \exp\left(-\frac{\kappa \cdot v_{ds}}{U_T}\right)\right], \quad (2)$$

where $I_0$ is a technology constant with units of amperes, W and L are the width and length of the transistor device, respectively, $K \approx 0.7$ is a unit less technology constant, and $U_T \approx 25$ mV is the well-known thermal voltage. In the subthreshold region, $I_D$ is usually below 1 μA, resulting in very low power consumption. The subthreshold region is also commonly known as weak inversion, because the mobile charge density in the transistor's channel is very small. Circuits based on this subthreshold model were popularized by Vittoz, et. al. [16].

If $v_{ds}$ is sufficiently large (around 150 mV), then it has little effect on $I_D$ in (2). When $v_{ds}$ is large enough to be neglected, the device is said to be in saturation. In the canonical approach, all transistors are assumed to be in saturation. To ensure this, the reference voltage $V_{ref} \approx 0.3V$ is used at the source of transistors 21, 22 and other row input current to voltage conversion devices. This maintains a sufficiently high voltage at the drain of each column input transistor 15, 17, 19 for the column input transistors to remain in saturation.

The Gilbert multiplier is based on the translinear, principle. According to this principle, in a closed (Kirchoff) loop of devices in which the current ($I_D$) is an exponential function of the voltage ($V_{gs}$), a sum of voltages is equivalent to a product of currents. Because the sum of forward voltage drops equals the sum of backward voltage drops around the loop, the product of forward currents equals the product of backward currents.

Figure 4:
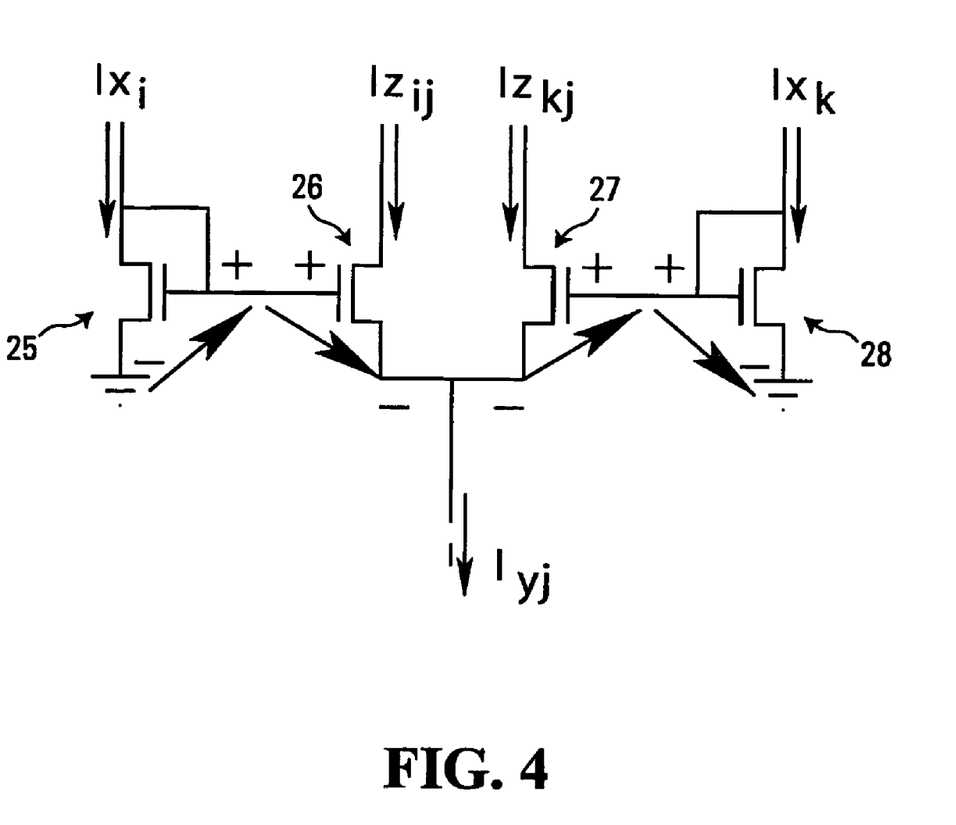
FIG. 4 is a schematic diagram of a first translinear loop.

By taking a closed loop beginning and ending at $V_{ref}$ and traversing the $V_{gs}$ of four devices 25, 26, 27, 28 as shown in FIG. 4, we arrive at $$Iz_{ij} \cdot Ix_k = Iz_{kj} \cdot Ix_i \quad (3)$$

$$\Rightarrow Iz_{kj} = Ix_k \frac{Iz_{ij}}{Ix_i}.$$

If the column input transistors 15, 17, 19 are saturated, their drains simply replicate the current inputs at corresponding current to voltage conversion devices 23, 24. Because the sources of their constituent transistors are all connected together, the sum of intermediate outputs from the j$^{th}$ multiplier module is equal to $Iy_j$. Thus $$\sum_k Iz_{kj} = Iy_j \quad (4)$$

$$\Rightarrow \frac{Iz_{ij}}{Ix_i} \sum_k Ix_k = Iy_j \quad (5)$$

$$\Rightarrow Iz_{ij} = \frac{Ix_i \cdot Iy_j}{\sum_k Ix_k}. \quad (6)$$

Because the algorithm specifies probability masses as the input and output of processing nodes, it may be assumed that the denominator of (6) is equal to one, in probability terms, and thus may be neglected.

Figure 5:
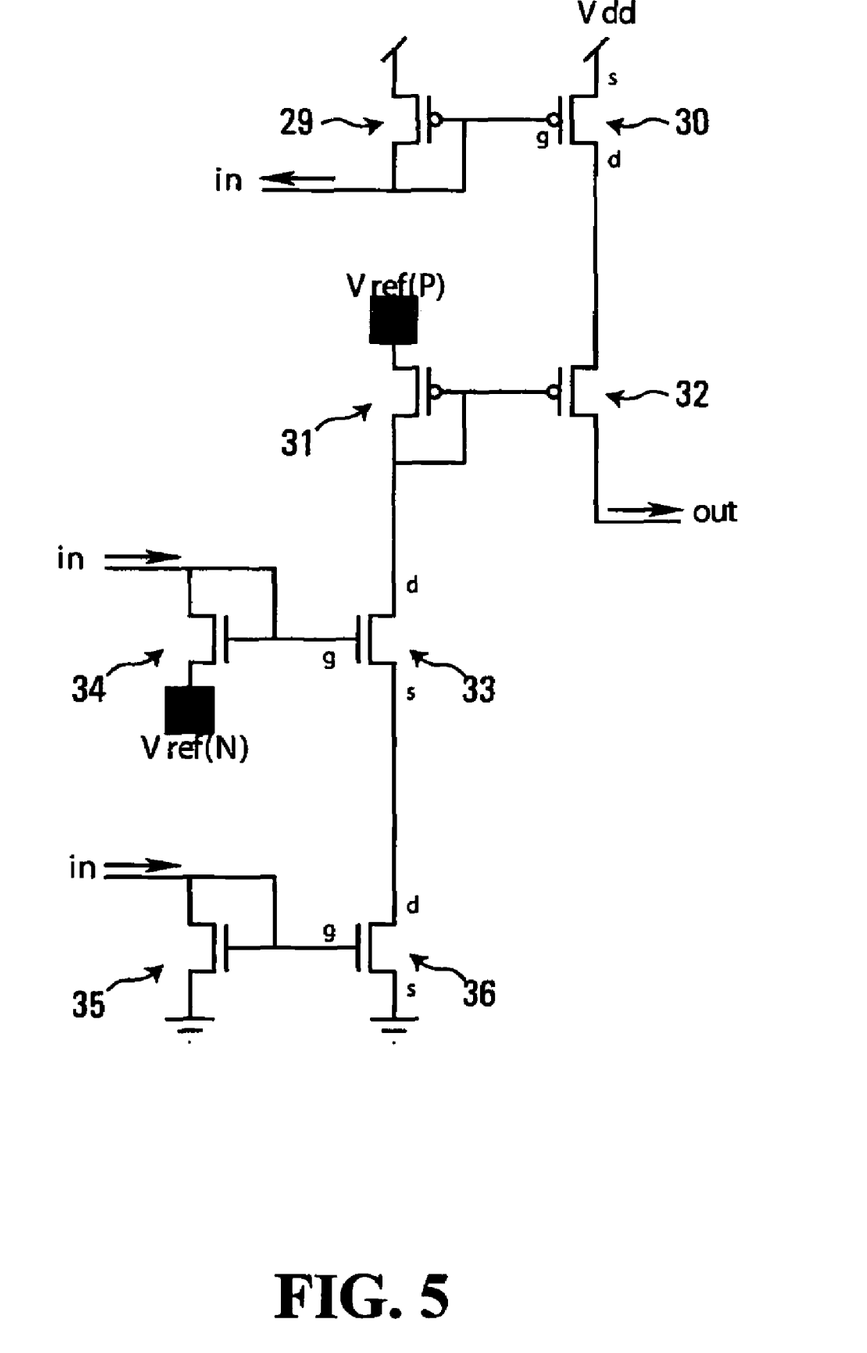
FIG. 5 is a schematic diagram of a folded Gilbert-based circuit topology.

The above requirement for saturation imposes a minimum allowed supply voltage on Gilbert-based circuits. It is common to use one Gilbert-based circuit made of NMOS devices, of which the outputs are "folded" into a second Gilbert-based circuit made of PMOS devices. A "slice" of this topology is illustrated in FIG. 5. The PMOS Gilbert-based circuit comprises a plurality of transistors 29, 30, 31, 32, and can perform either a second sum-product operation or provide renormalization of currents to boost the output currents so that their sum equals a desired unit current. The renormalization module 12 in FIG. 2 represents this renormalization function. The PMOS transistors 29, 30, 31, 32 must also be in saturation, and must have their own separate $V_{ref}$. In FIG. 5, the separate $V_{ref}$'s are indicated by $V_{ref}(N)$ and $V_{ref}(P)$. The operation of the folded topology shown in FIG. 5 will be apparent to those skilled in the art.

It is clear in FIG. 5 that the terminals of four devices are traversed between Vdd and ground. The transistor devices 30, 33, and 36 must remain in saturation for the circuit to function properly. As a rough analysis, a voltage of at least 300 mV between the drain and source of each device may be required. The drain of the device 33 is typically ~350 mV below $V_{ref}$ (P). The drain of the device 30 is commonly in the range $V_{ref}(P) \pm 50$ mV. The source of the device 33 is typically $V_{ref}(N) \pm 50$ mV. Assuming the extreme cases, saturation requires a supply voltage no less than 1.35V. If the saturation requirement is relaxed to a $v_{ds}$ of 150 mV, then the supply voltage can be no less than 0.9V.

This result is based on the saturation assumption. In practice, saturation is only an approximate condition. The output of the folded circuit does always depend slightly on the other inputs. As $V_{ref}(P)$ is increased and $V_{ref}(N)$ is decreased, the device becomes less saturated, and the output begins to change dramatically. In the extreme case where $V_{ref}(P) = V_{dd}$ and $V_{ref}(N) = 0$, we must use the full model expressed in (2), without neglecting $V_{ds}$.

Figure 6:
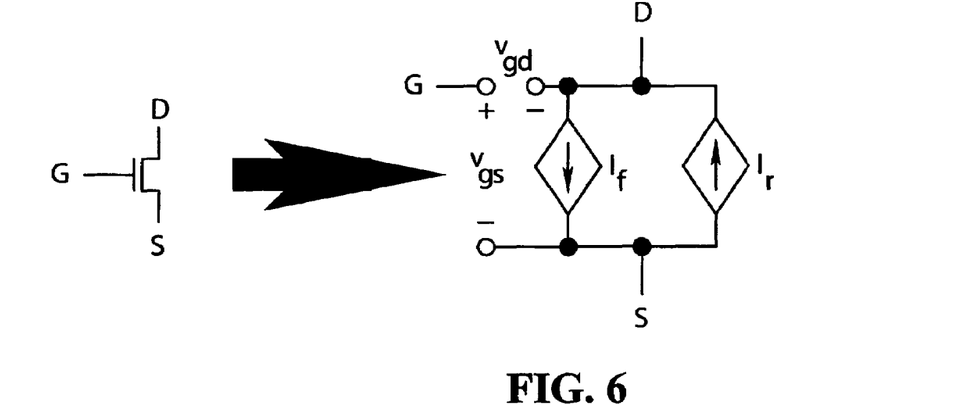
FIG. 6 is a schematic diagram representing a non-saturation MOS model.

When a transistor is not in saturation, the translinear principle still applies. The complete non-saturation MOS device model is illustrated in FIG. 6. The total device current is divided into two oppositely directed components. The forward component, $I_f$, is controlled by $v_{gs}$. The backward component, $I_r$, is controlled by $v_{gd}$. The total current is $I_D = I_f - I_r$. To solve circuits with unsaturated transistors, translinear loops must traversed $v_{gd}$ as well as $V_{gs}$.

Figures 7, 8:
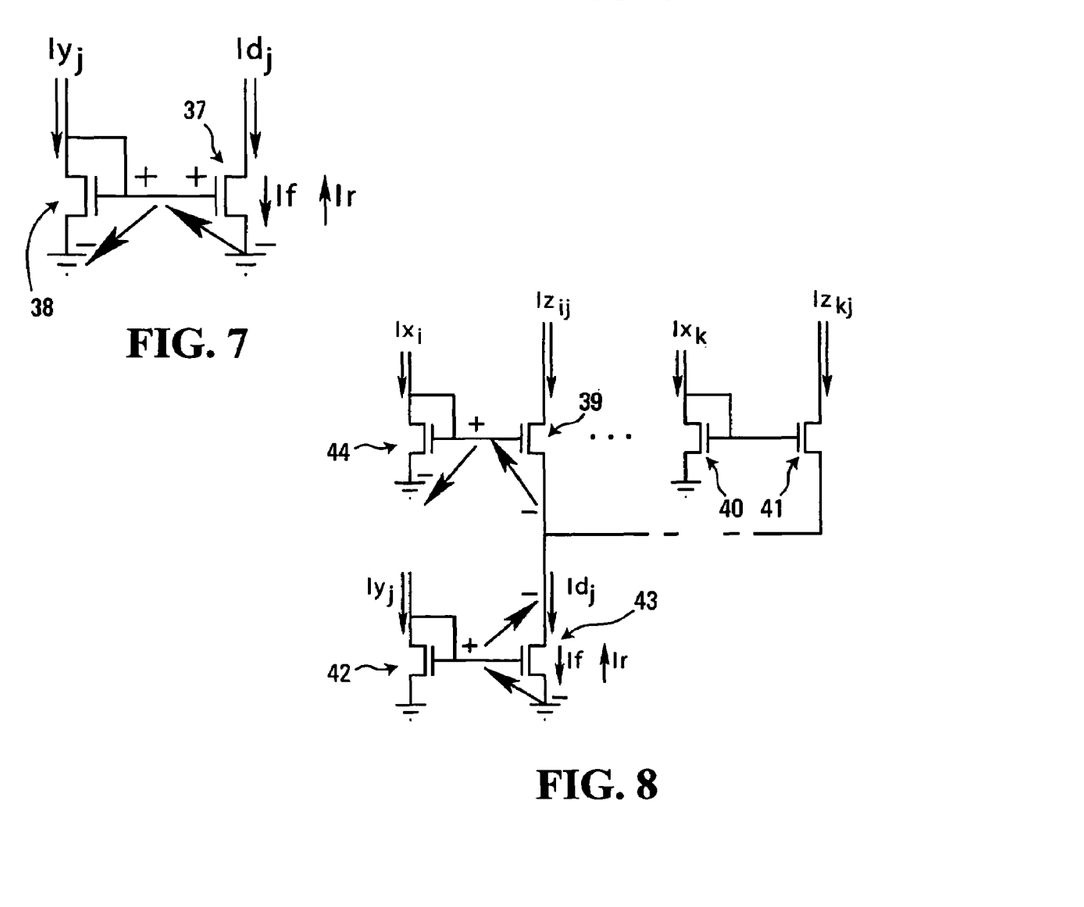
FIG. 7 is a schematic diagram of a second translinear loop.
FIG. 8 is a schematic diagram of a third translinear loop.

It is clear from the foregoing that the voltage needs of the Gilbert multiplier can be reduced if $V_{ref} = 0$. This results in the column input transistors 15, 17, 19 becoming unsaturated. This situation can be analyzed using the translinear principle. The circuit consists of the translinear loops shown in FIGS. 4, 7, and 8. The first loop, shown in FIG. 4, was analyzed above, and yields the equation $$Ix_i \cdot Iz_{kj} = Iz_{ij} \cdot Ix_k, \quad (7)$$

such that in FIG. 7

$$If = Iy_j. \quad (8)$$

FIG. 7 shows a column input current to voltage conversion transistor 38 connected to an unsaturated column input transistor 37, with its additional component $I_r$. The current $I_{dj}$ is defined as $$Id_j = If - Ir. \quad (9)$$

The role of the source-connected transistors, from (4), may be expressed as:

$$Id_j = \sum_k Iz_{kj}. \quad (10)$$

To solve for all currents in the circuit, we need one more equation, which is provided by the third loop, through the devices 43, 39, 44 shown in FIG. 8 also shown:

$$Iz_{ij} \cdot If = Ir \cdot Ix_i \quad (11)$$

$$\Rightarrow Ir = Iy_j \cdot \frac{Iz_{ij}}{Ix_i}. \quad (12)$$

Although the devices 40, 41, 42 are shown in FIG. 8 for completeness, the above particular example third loop does not include these devices.

Combining (7) through (12), we arrive at $$Id_j = Iy_j - Iy_j \cdot \frac{Iz_{ij}}{Ix_i} \quad (13)$$

$$\Rightarrow \sum_k Iz_{kj} = Iy_j - Iy_j \cdot \frac{Iz_{ij}}{Ix_i} \quad (14)$$

$$\Rightarrow \frac{Iz_{ij}}{Ix_i} \sum_k Ix_k + Iy_j \cdot \frac{Iz_{ij}}{Ix_i} = Iy_j \quad (15)$$

$$\Rightarrow Iz_{ij} = \frac{Iy_j \cdot Ix_i}{\sum_k Ix_k + Iy_j}. \quad (16)$$

The result (16) is almost the same as the normal Gilbert multiplier output (6), except there is an additional term in the denominator. In probability terms, the denominator of (16) can no longer be neglected. To solve this problem, in accordance with an embodiment of the invention, additional transistors are provided with their sources connected to $Id_j$. If these transistors represent a current $I_\epsilon = \Sigma_{l \neq j} Iy_l$, then the output becomes $$Iz_{ij} = \frac{Iy_j \cdot Ix_i}{\sum_k Ix_k + I_\delta + Iy_j} \quad (17)$$

$$\Rightarrow Iz_{ij} = \frac{Iy_j \cdot Ix_i}{\sum_k Ix_k + \sum_{i \neq j} Iy_l + Iy_j} \quad (18)$$

$$\Rightarrow Iz_{ij} = \frac{Iy_j \cdot Ix_i}{\sum_k Ix_k + \sum_i Iy_i}. \quad (19)$$

In probability terms, the denominator of (19) is a constant and can be neglected. The addition of redundant transistors therefore corrects the probability calculation of the Gilbert multiplier when $V_{ref}=0$. Because these new transistors do not provide useful outputs, they are referred to herein as dummy transistors or dummy inputs. The drains of these transistors are preferably connected to Vdd.

Figure 9:
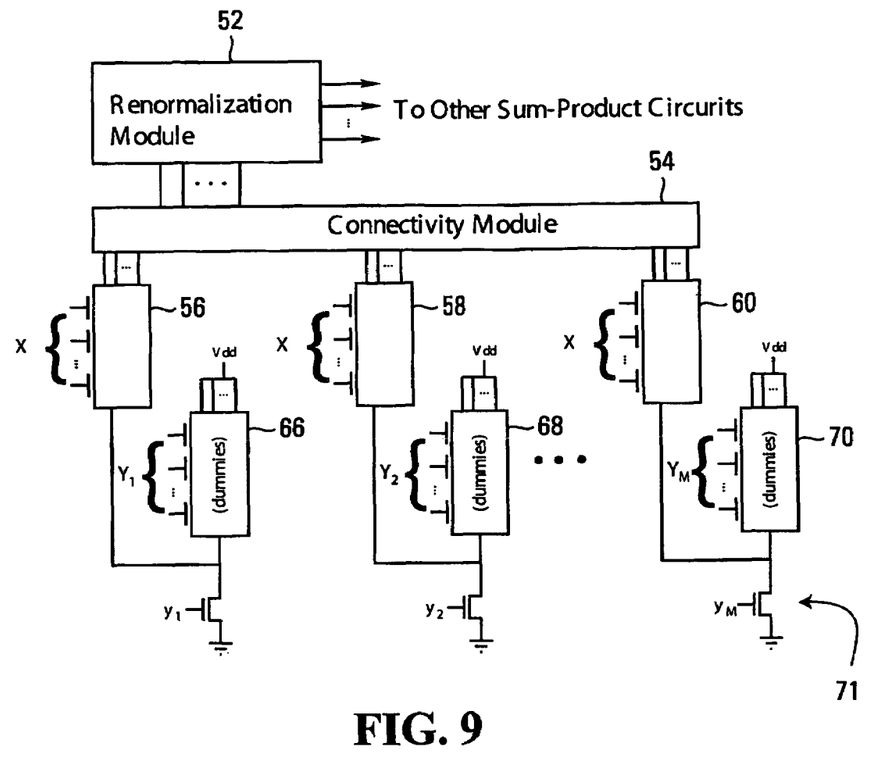
FIG. 9 is a block diagram of a low-voltage CMOS sum-product circuit according to an embodiment of the invention.

FIG. 9 is a block diagram of a low-voltage CMOS sum-product circuit according to an embodiment of the invention, comprising a renormalization module 52, a connectivity module 54, a plurality of multiplier modules 56, 58, and 60, a plurality of dummy multiplier modules 66, 68, and 70, and a plurality of column input transistors generally designated by 71. In FIG. 9, X denotes an ordered sequence of row inputs (voltages) $<X1, \ldots, X_N>$, and $Y_k$ denotes a set of column inputs (voltages) $\{y_l\}_{l=1}^M$ excluding the input $Y_k$. The members of $Y_k$ need have no particular order. If necessary, current inputs $Ix_i$ and $Iy_l$ are converted into voltage inputs $x_i$ and $y_l$ by diode-connected transistors as shown in FIG. 3b and described above.

All transistor devices used to implement the sum-product circuit in FIG. 9 preferably. have the same dimensions, with the possible exception of the transistors, illustratively PMOS transistors, used in the renormalization module 52. Renormalization is described in further detail below. As described above, desired products from the multiplier modules 56, 58, and 60 are summed together by shorting wires in the connectivity module 54, and unused products are shorted to Vdd.

In a practical setting, the sum-product algorithm is carried out repeatedly in a chain of computations. The output of one computation provides input for the next. In an analog implementation, each computation is performed by a separate sum-product module. A complete analog error control decoder consists of cascades of sum-product modules.

For a low-voltage decoder, renormalization of currents between modules is preferred. In a canonical Gilbert-based sum-product circuit with outputs expressed by (6), the denominator is equivalent to '1' and can be truly ignored. In the low voltage output expressed by (19), however, the denominator is equivalent to '2', which results in substantial attenuation at the output of each circuit. While, in principle, linear attenuation will not change the. result of decoding, consistent attenuation in a large network will cause the outputs to approach zero, making it impossible to extract any results, and causing the circuit to slow to a halt.

Figure 10:
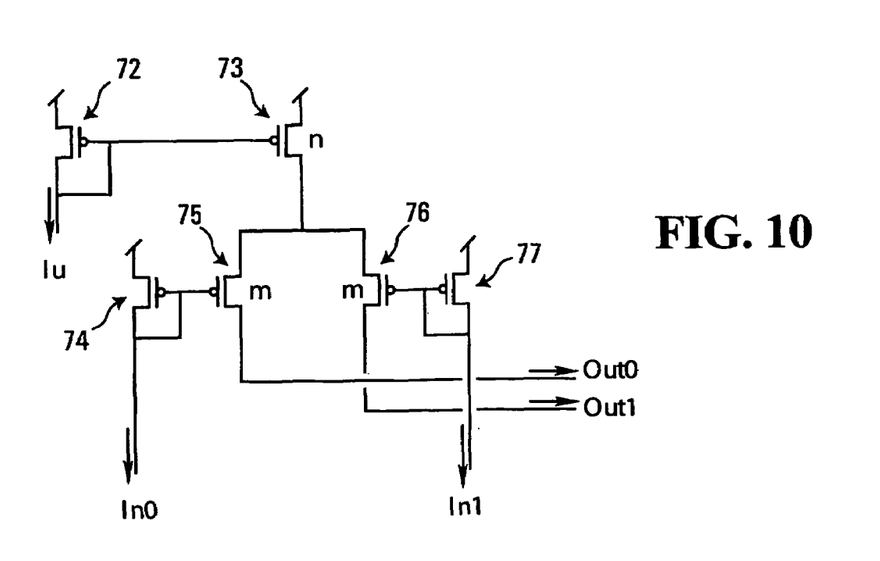
FIG. 10 is a schematic diagram of an example renormalization circuit.

By inserting the renormalization module 52 between sum-product circuits, the current outputs are prevented from approaching zero. A renormalization circuit that may be implemented in the sum-product circuit of FIG. 9 is shown in FIG. 10. The parameters m and n indicate that the transistor's width is increased by a factor of m or n relative to other transistors used in a sum-product circuit. Canonical Gilbert-based sum-product circuits typically use m=1 and n=1.

The circuit of FIG. 10 is basically a low-voltage sum-product circuit with only a single column input $I_u$, which represents a global reference current, and a plurality of PMOS transistors 72, 73, 74, 75, 76, 77. In probability terms, $I_u \propto 1$. The behaviour of FIG. 10 is described by the equation $$Out_i = \frac{n \cdot m \cdot I_u \cdot In_i}{n \cdot I_u + m \cdot \sum_k In_k}, \quad (20)$$

which is a generalization of (16). As demonstrated by (20), the renormalization circuit of FIG. 10 boosts each input by a constant factor, and is thus a linear transformation. The probability information is therefore not subject to distortion due to renormalization.

Because sum-product circuits will normally be situated in a network, the iterated behaviour of (20) should also be considered. This can be simplified to a one-dimensional problem by using a summary variable k for each set of probabilities, defined as $$k_x \equiv \frac{\sum_i Ix_i}{I_u}. \quad (21)$$

This allows the treatment of (20) as a simple one-dimensional transfer function, $$k_{Out} = \frac{n \cdot m \cdot k_{In}}{n + m \cdot k_{In}}. \quad (22)$$

Figure 11:
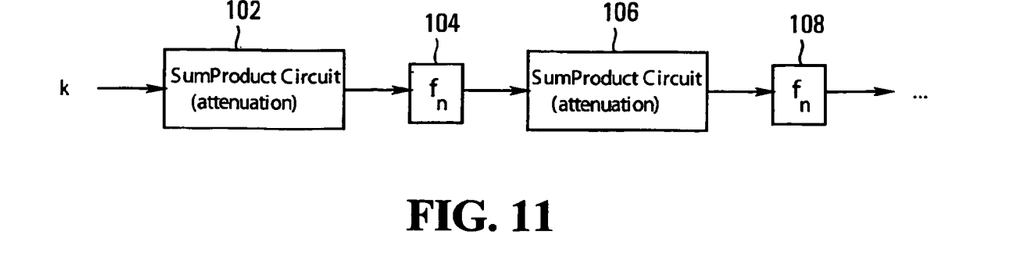
FIG. 11 is a block diagram representing iterated sum-product functions with renormalization.

Iteration of (22) is illustrated in FIG. 11. The blocks 104 and 108 labeled $f_n$ represent the transfer function (22), and are respectively connected to the outputs of the sum-product circuits 102 and 106. To determine the dynamic behaviour of this system, the fixed points (where $k_{Out}=k_{In}$) are identified, and a determination is then made as to whether they are stable. As those skilled in the art will appreciate, it can be shown that the fixed points occur at $k_0=0$ and (23)

$k_1=n-n/m$. (24)

It is well known that a fixed point is stable and non-oscillating if and only if the slope of the transfer function, $f'_n(k)$, satisfies $0 \leq f'_n(k_f) < 1$ at the fixed point $k_f$. Also, a fixed point $k_f$ is unstable (i.e. it is a repeller) if and only if $f'_n(k_f) > 1$. It can also be shown that $f'_n(0)=m$ and (25)

$f'_n(k_1)=1/m$. (26)

Equations (25) and (26) show that there is always a stable fixed point above zero when m>1. Known renormalizers use m=1, and therefore cause all currents to approach zero in a low-voltage network. By using m>1, this can be avoided.

Figure 12:
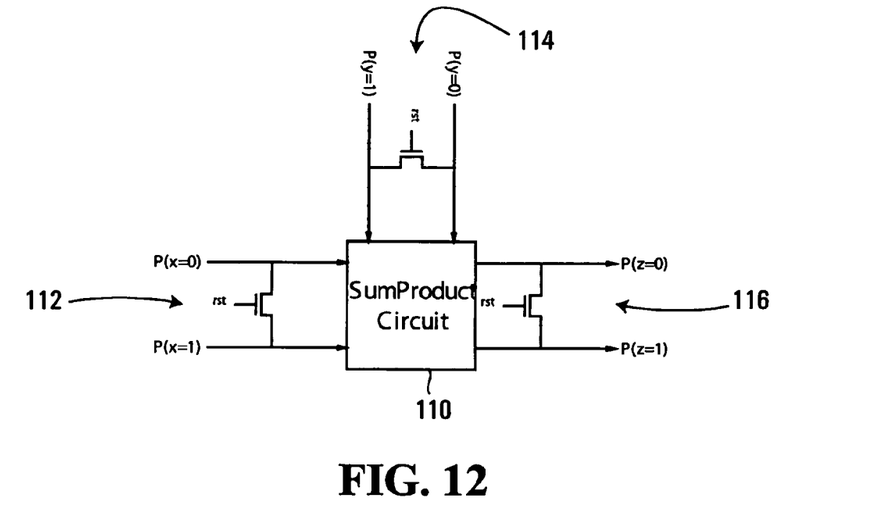
FIG. 12 is a block diagram of an example reset circuit.

In a low-voltage design, use of a reset circuit is also preferred. An example of such a circuit is shown in FIG. 12, comprising transistors 112, 114, and 116 connected across inputs and outputs of a sum-product circuit 110. The transistors 112, 114, and 116 provide for restoration of a sum-product network to an unbiased state when decoding of one block of information is complete. When the digital 'rst' signal in FIG. 12 is high, all probabilities are shorted together at the inputs and outputs of the sum-product circuit 110, which may also be considered a local processing node. The transistors 112, 114, and 116 act as switches and are shown in FIG. 12 as NMOS transistors. After a short settling time, the 'rst' signal falls low again, the transistors 112, 114, and 116 become open switches, and the sum-product circuit 110, as well as other such circuits connected in a network, is ready to process new information.

Reset circuits are well known in Gilbert-based designs, having been studied, for example, in the PhD theses of Felix Lichtenberger [11] and Jie Dai [4]. Their value seems debatable in canonical Gilbert circuits. For low-voltage circuits as in FIG. 9 and other types of circuits that may have a stronger memory effect, the use of reset circuits is generally preferred.

One very common class of decoders employ the BCJR algorithm. This algorithm is used with concatenated convolutional codes, such as Turbo codes and Turbo equalizers. The BCJR algorithm [2] is a special case of the sum-product algorithm (1), as shown in [9]. In the BCJR algorithm, variables are often not binary.

Figure 13A:
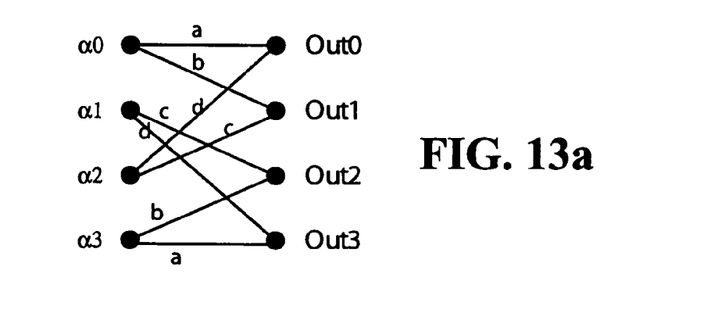
FIG. 13a shows an example trellis stage.

A trellis stage is a portion of a trellis graph which describes a boolean constraint function. The graph of a trellis stage consists of two columns of states, connected by branches. An example trellis stage is shown in FIG. 13a. The states on the left represent the possible values of a random state variable $\alpha$. The states on the right represent the possible values of the output variable. The labels on branches represent the possible values of a branch variable, y. If a branch exists for a particular combination ($\alpha_i$, $y_j$, $Out_k$), then the constraint is satisfied for that combination.

Figure 13B:
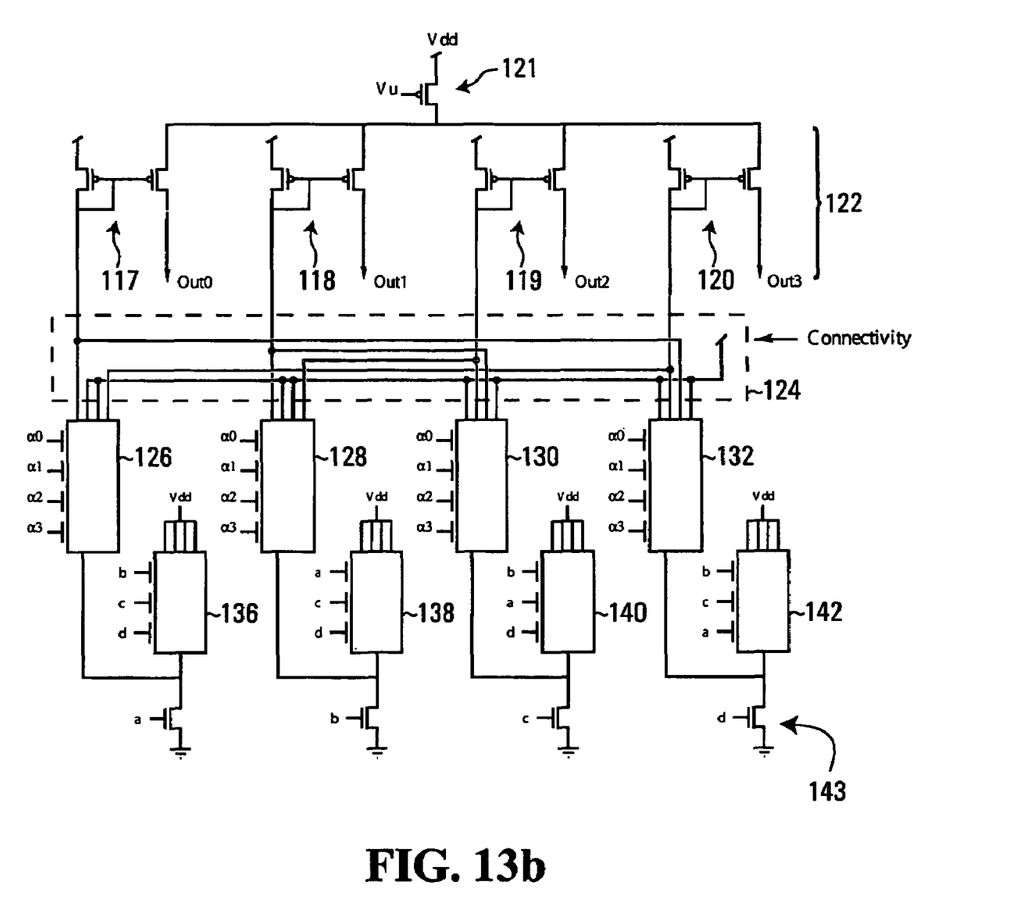
FIG. 13b is a block diagram of an example low-voltage sum-product architecture according to an embodiment of the invention for computing on trellis graphs.

An example of the low-voltage sum-product architecture for computing on trellis graphs is shown in FIG. 13b. As shown, the sum-product circuit comprises a renormalization module 122 having a plurality of transistor pairs 117, 118, 119, 120 and a single column input transistor 121, a connectivity module 124, a plurality of multiplier modules 126, 128, 130, 132, a plurality of dummy multiplier modules 136, 138, 140, 142, and a plurality of column input transistors generally designated by 143. The branch variable takes values from the set {a, b, c, d}. The sum-product equation for this particular trellis section can be written in matrix form as $$\begin{bmatrix} Out0 \\ Out1 \\ Out2 \\ Out3 \end{bmatrix} = \begin{bmatrix} a & & & d \\ b & c & & \\ & c & b & \\ & d & & a \end{bmatrix} \times \begin{bmatrix} \alpha0 \\ \alpha1 \\ \alpha2 \\ \alpha3 \end{bmatrix}. \quad (27)$$

The particular trellis function is determined by the connectivity module 124.

The sum-product circuit is shown with the state probabilities as row inputs and the branch probabilities as column inputs, but these roles can be reversed without affecting the results. Every stage of the BCJR algorithm consists of a matrix multiplication of the form (27). Low-voltage sum-product circuits can therefore be easily produced to implement a complete BCJR decoder.

Figure 14A:
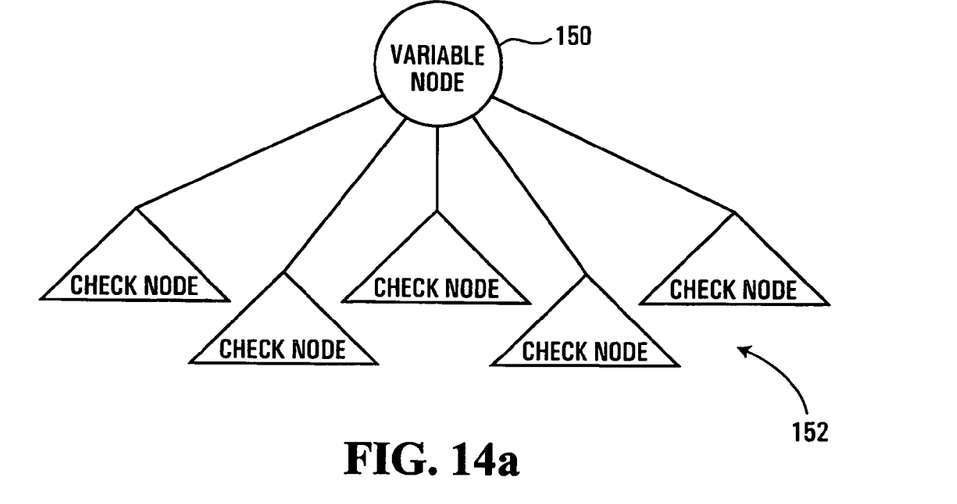
FIG. 14a shows an example Tanner Graph.

Decoders for binary LDPC codes are mapped from the code's normalized Tanner Graph, which is a direct visualization of the code's binary parity check matrix. The Tanner Graph contains two types of nodes, check nodes and variable nodes. A variable node denotes a particular bit in a codeword. A check node represents a parity check equation, which is a single row in the parity check matrix. All variables in the graph are binary. For implementations, this means that all probability masses will have only two components. FIG. 14a shows an example Tanner Graph that contains a variable node 150 and a plurality of check nodes 152.

Figure 14B:
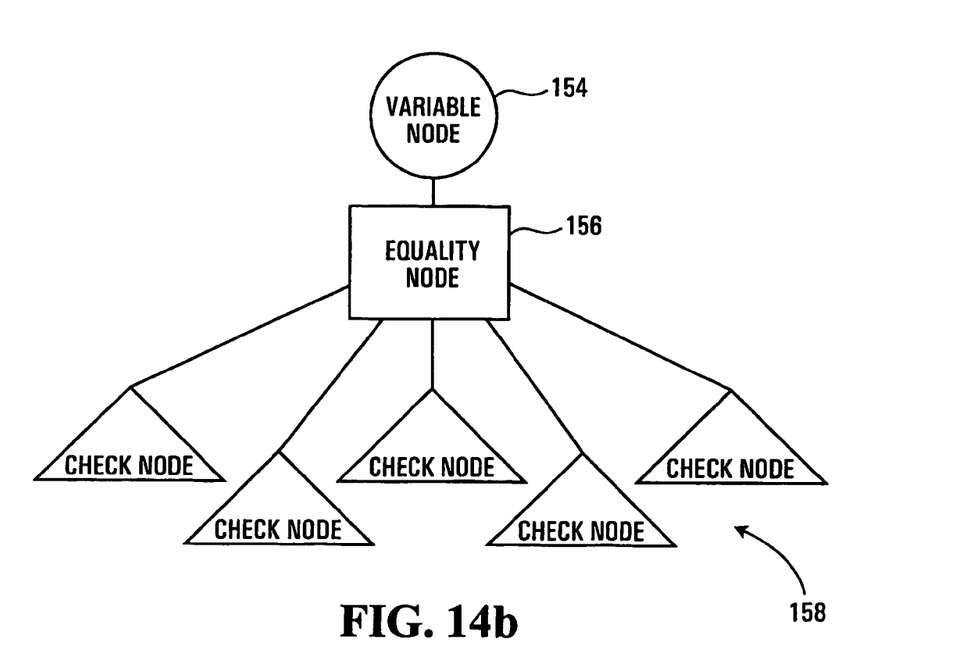
FIG. 14b shows an example normalized Tanner Graph.

In a normalized Tanner Graph, also known as a Forney Graph, equality nodes are inserted between variable nodes and check nodes [5]. This is illustrated in FIG. 14b, in which an equality node 156 is inserted between a variable node 154 and a plurality of cheek nodes 158.

The purpose of equality node insertion is to provide explicit representation for the constraint which occurs at variable nodes: all connected edges convey the same variable. Let $U_i$ be the set of check nodes connected to variable i, and let $u_j$ be the binary value from check node j. The equality constraint is satisfied if and only if $$u_j = u_k, \forall j, k \in U_i. \tag{28}$$

The check node is only slightly more complicated. Let $V_j$ be the set of variables which are connected to check node j, and let $v_i$ be the value of variable i. Parity check j is then satisfied if and only if $$\bigoplus_{i \in V_j} v_i = 0, \tag{29}$$

where '$\oplus$' denotes modulo-2 summation.

Figure 15:
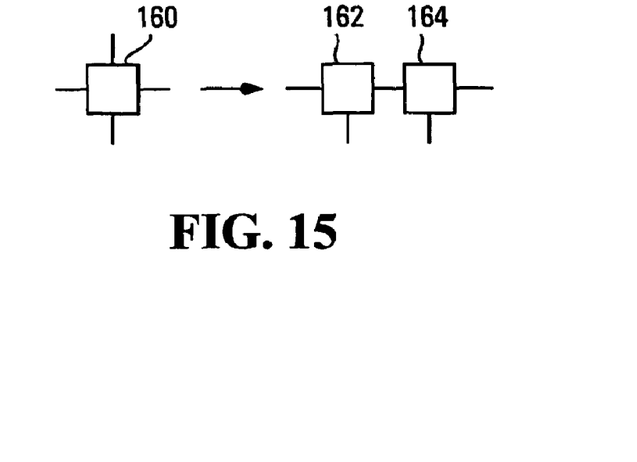
FIG. 15 is a block diagram representation of the construction of a 4-edge node from two 3-edge nodes.

The constraints in (28) and (29) can be conveniently broken down into recursive operations, allowing, the construction of nodes with many edges by connecting 3-edge nodes in a chain. This is illustrated in FIG. 15, for example, in which a 4-edge node 160 is shown with an equivalent implementation as two 3-edge nodes 162 and 164. Therefore, the construction of larger nodes using 3-edge nodes will be apparent from the description of the implementation of 3-edge nodes.

For a 3-edge check node, the constraint function is simply a logical XOR operation. Mapping this to a sum-product implementation, and labeling the three edges X, Y, and Z, we obtain.

$$P(Z=0) = P(X=0) \cdot P(Y=0) + P(X=1) \cdot P(Y=1) \tag{30}$$

$$P(Z=1) = P(X=1) \cdot P(Y=0) + P(X=0) \cdot P(Y=1) \tag{31}$$

For a 3-edge equality node, we obtain $$P(Z=0) \propto P(X=0) \cdot P(Y=0) \tag{32}$$

$$P(Z=1) \propto P(X=1) \cdot P(Y=1). \tag{33}$$

The proportionality symbol is used to indicate that the algorithm is invariant to multiplication by any non-zero normalizing constant.

Figure 16:
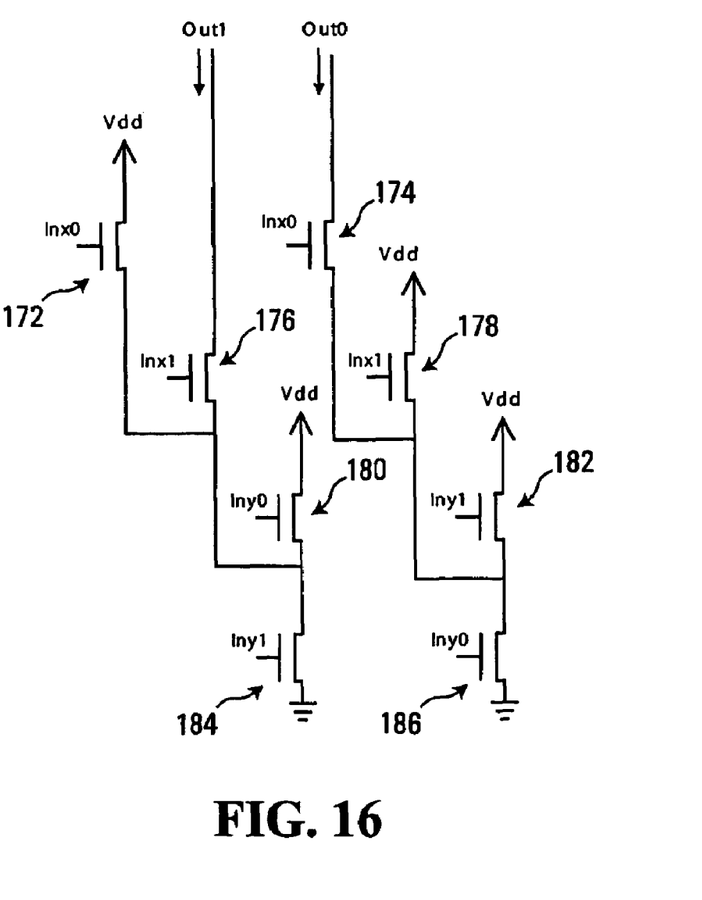
FIG. 16 is a schematic diagram of a 3-edge equality node.
Figure 17:
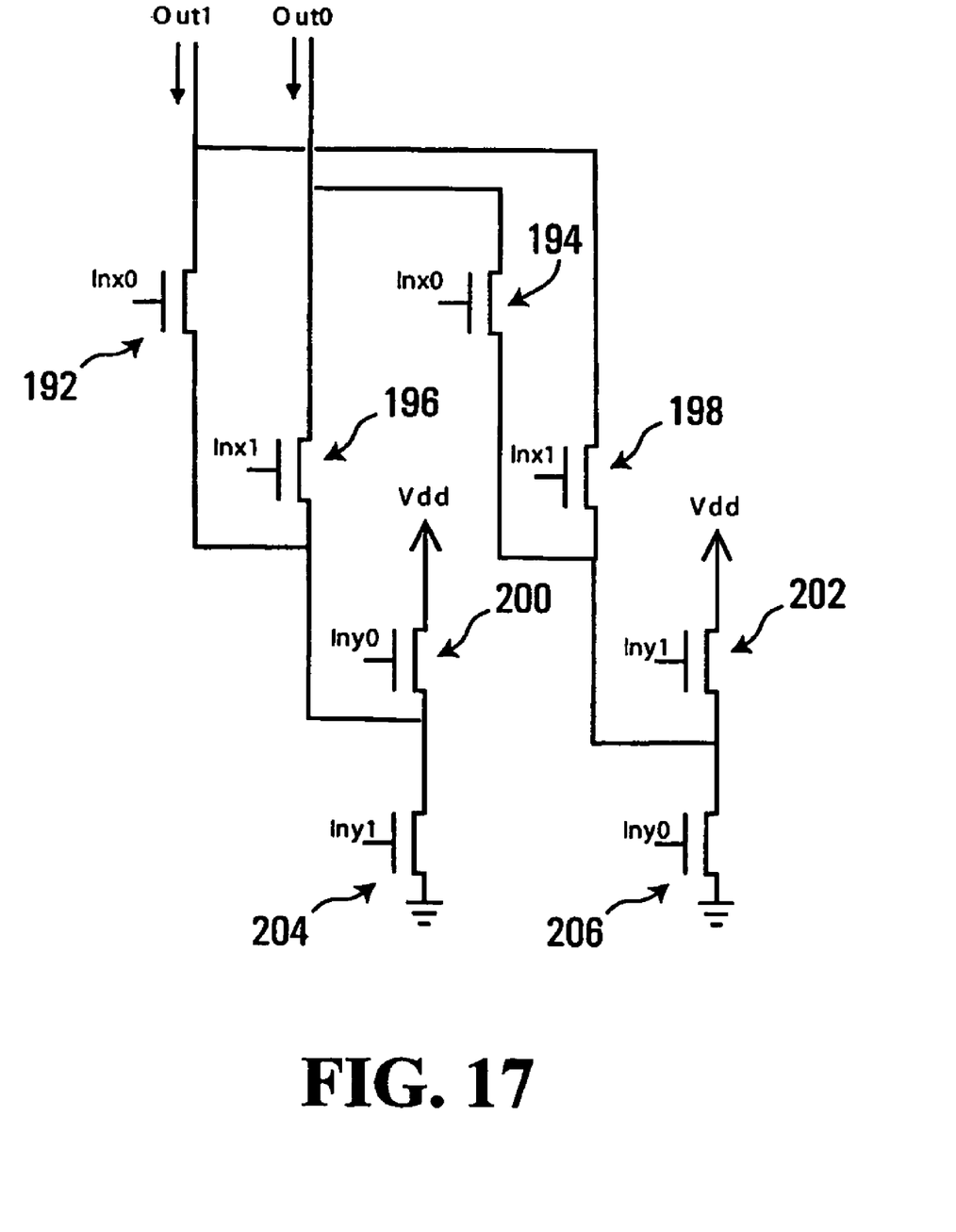
FIG. 17 is a schematic diagram of a 3-edge check node.

Applying the general circuit of FIG. 9, and varying the connectivity to produce the appropriate functions, we arrive at the circuits of FIGS. 16 and 17 for a 3-edge equality node and a 3-edge check node, respectively. As above, the 'y' inputs are the column. inputs, and the 'x' inputs are the. row inputs. In FIGS. 16 and 17, the transistors 172, 174, 176, 178 and 192, 194, 196, 198 form the multiplier modules, the transistors 184, 186 and 204, 206 are column input transistors, and the transistors 180, 182 and 200, 202 form the dummy multiplier modules. The renormalization module is not shown in FIGS. 16 and 17, but is preferably present. Complete decoders for linear binary block codes, including LDPC codes, can be constructed from these 3-edge circuits. Of course, as those skilled in the art will appreciate, conversion modules, voltage to current conversion modules in the example circuits shown in FIGS. 16 and 17, may be provided between circuits where circuit outputs are to be converted for input to a next circuit.

What has been described is merely illustrative of the application of the principles of the invention. Other arrangements and methods can be implemented by those skilled in the art without departing from the spirit and scope of the present invention.

For example, the invention is in no way limited to the particular implementations shown as illustrative examples in the drawings. Alternate implementations, using different elements and/or different types of components, will be apparent to those skilled in the art.

The invention may also be applied to other types of decoding. than the trellis and LDPC decoding described above.

REFERENCES

[1] J. B. Anderson and S. M. Hladik. Tailbiting MAP decoders. *IEEE Journal on Selected Areas in Communications*, 16(2) :297-302, February. 1998.

[2] L. R. Bahl, J. Cocke, F. Jelinek, and J. Raviv. Optimal decoding of linear codes for minimizing symbol error rate. *IEEE Transactions on Information Theory*, 20(2) :284-287, March 1974.

[3] C. Berrou, A. Glavieux, and P. Thitimajshima. Near Shannon-limit error-correcting coding and decoding: Turbo codes. 44:1261-1271, October 1996.

[4] Jie Dai. *Design Methodology for Analog VLSI Implementations of Error Control Decoders*. Ph.D. Thesis, University of Utah, December 2001.

[5] G. D. Forney. Codes on graphs: normal realizations. 47(2):520-548, February 2001.

[6] J. Hagenauer, E. Offer, and L. Papke. Iterative decoding of binary block and convolutional codes. 42(2):429-445, March 1996.

[7] J. Hagenauer and M. Winklhofer. The analog decoder; *Proc. International Symposium on Information Theory*, page 145, August 1998.

[8] A. Graell i Amat, G. Montorsi, A. Neviani, and A. Xotta. An analog decoder for concatenated magnetic recording schemes. pages 1563-1568, April 2002.

[9] F. R. Kschischang, B. J. Frey, and H. A. Loeliger. Factor graphs and the sum-product algorithm. 47(2):498-519, February 2001.

[10] H. A. Loeliger, F. Lustenberger, M. Helfenstein, and F. Tarkoy. Probability propagation and decoding in analog VLSI. 47(2):837-843, February 2001.

[11] F. Lustenberger. *On the Design of Analog VLSI Iterative Decoders*. PhD thesis, Swiss Federal Institute of Technology, 2000.

[12] F. Lustenberger, M. Helfenstein, G. S. Moschytz, H. A. Loeliger, and F. Tarkoy. All analog decoder for (18,9,5) tail-biting trellis code. pages 362-365, Sept. 1999.

[13] M. Moerz, T. Gabara, R. Yan, and J. Hagenauer. An analog 0.25 µm BiCMOS tailbiting MAP decoder. In International Solid State Circuits Conference, pages 356-357, February 2000.

[14] A. Mondragon-Torres and E. Sanchez-Sinencio. Floating gate analog implementation of the additive soft-input soft-output decoding algorithm. pages 89-92, May 2002.

[15] M. Valenti, N. Correal, and J. Heck. An analog Turbo decoder for an (8,4) product code. In Proc. *IEEE Midwest Symp. on Circuits and Systems*. Tulsa, August 2002.

[16] E. Vittoz and J. Fellrath. CMOS analog integrated circuits based on weak inversion operation. *IEEE Journal of Solid-State Circuits*, pages 224-231, December 1977.

[17] N. Wiberg, H. A. Loeliger, and R. Kotter. Codes and iterative decoding on general graphs. *European Transactions on Telecommunications*, pages 513-525, September/October 1995.

[18] C. Winstead, J. Die, W. J. Kim, S. Little, Y. -B. Kim, C. J. Myers, and C. Schlegel. Analog MAP decoder for (8,4) Hamming code in subthreshold CMOS. pages 132-147, March 2001.

The invention claimed is:

1. An electronic circuit comprising:
a plurality of multiplier modules for receiving a plurality of first input signals and respective ones of a plurality of second input signals, each multiplier module configured to generate as output signals products of the plurality of first input signals and its respective one of the plurality of second input signals; and a plurality of dummy multiplier modules for receiving the plurality of second input signals, each dummy multiplier module corresponding to a respective one of the plurality of multiplier modules and configured to form products of the respective one of the plurality of second input signals of its corresponding multiplier module and the second input signals other than the respective one of the plurality of second input signals.

2. The circuit of claim 1, wherein each of the multiplier modules comprises a plurality of transistors for receiving respective ones of the plurality of first input signals and the respective one of the plurality of second input signals.

3. The circuit of claim 2, wherein each of the plurality of transistors comprises a control terminal for receiving the respective one of the plurality of first input signals, a first switched terminal for receiving the respective one of the plurality of second input signals, and a second switched terminal on which the output signals are generated.

4. The circuit of claim 1, wherein each of the dummy multiplier modules comprises a plurality of transistors for receiving the respective one of the plurality of second input signals and respective ones of the other second input signals.

5. The circuit of claim 4, wherein each of the plurality of transistors comprises a first switched terminal for receiving the respective one of the plurality of second input signals, a control terminal for receiving the respective one of the other second input signals, and a second switched terminal on which the products are formed.

6. The circuit of claim 5, wherein the second switched terminals of the plurality of transistors are connected to a predetermined voltage.

7. The circuit of claim 1, further comprising a connectivity module for receiving the output signals from the plurality of multiplier modules and configured to generate as output signals sums of predetermined ones of the output signals from the plurality of multiplier modules.

8. The circuit of claim 7, wherein the connectivity module comprises inputs for receiving the output signals from the plurality of multiplier modules and outputs for outputting the output signals of the connectivity module, and wherein the predetermined ones of the output signals from the plurality of multiplier modules are determined by connections between the inputs and the outputs.

9. The circuit of claim 7, further comprising a renormalization module for receiving the output signals from the connectivity module and configured to normalize the output signals from the connectivity module to thereby generate output signals that sum to a predetermined unit value.

10. The circuit of claim 1, wherein each of the multiplier modules and the dummy multiplier modules comprises a plurality of CMOS (Complementary Metal Oxide Semiconductor) transistors.

11. A sum-product circuit comprising:

a plurality of first inputs for receiving respective first input signals;

a plurality of second inputs for receiving second input signals;

a plurality of multiplier modules connected to the first inputs and a respective one of the second inputs, each multiplier module configured to generate as intermediate output signals products of the first input signals and the second input signal on its respective one of the second inputs;

a plurality of dummy multiplier modules connected to the second inputs, each dummy multiplier module corresponding to a respective one of the plurality of multiplier modules and configured to form products of the second input signal of its corresponding multiplier module and the second input signals other than the second input signal of its corresponding multiplier module;

a connectivity module for receiving the intermediate output signals and configured to generate as output signals sums of predetermined ones of the intermediate output signals; and a plurality of output terminals for outputting the output signals.

12. The sum-product circuit of claim 11, wherein the first input signals, the second input signals, and the output signals encode respective probability masses.

13. The sum-product circuit of claim 11, wherein one of the first input signals and the second input signals comprise state probabilities for a plurality of input states of a random variable, the output signals comprise state probabilities for a plurality of output states of the random variable, and the other of the first input signals and the second input signals comprise branch probabilities for transitions between the input states and the output states.

14. The sum-product circuit of claim 11, further comprising a renormalization module for receiving the output signals and boosting signal levels of the output signals to thereby generate output signals that sum to a predetermined unit value.

15. The sum-product circuit of claim 14, wherein the multiplier modules, the dummy multiplier modules, and the renormalization module comprise respective pluralities of CMOS (Complementary Metal Oxide Semiconductor) devices.

16. The sum-product circuit of claim 15, wherein the CMOS devices of the multiplier modules and the dummy multiplier modules are a different type than the CMOS devices of the renormalization circuit.

17. The sum-product circuit of claim 11, further comprising a plurality of reset switches connected across the first inputs, the second inputs, and the outputs and configured to short the first inputs, to short the second inputs, and to short the outputs in response to a reset signal.

18. The sum-product circuit of claim 11, wherein the multiplier modules and the dummy multiplier modules comprise respective pluralities of CMOS (Complementary Metal Oxide Semiconductor) devices.

19. A signal decoder comprising a plurality of the sum-product circuits of claim 11, wherein the outputs of at least one of the plurality of sum-product circuits are connected to either the first inputs or the second inputs of another one of the sum-product circuits to implement a decoding algorithm.

20. The signal decoder of claim 19, further comprising a renormalization module connected to the outputs of the at least one of the plurality of sum-product circuits for adjusting signal levels of the output signals on the outputs.

21. The signal decoder of claim 19, wherein the decoding algorithm comprises is associated with an LDPC (low-density parity check) code, and wherein the plurality of sum-product circuits comprises a sum-product circuit configured as a check node and a sum-product circuits configured as an equality node representing the LDPC code.

* * * * *